US009634651B1

(12) United States Patent
Tseng

(10) Patent No.: US 9,634,651 B1
(45) Date of Patent: Apr. 25, 2017

(54) DELAY APPARATUS

(71) Applicant: Novatek Microelectronics Corp., Hsinchu (TW)

(72) Inventor: Wei-Sheng Tseng, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 15/210,870

(22) Filed: Jul. 14, 2016

(51) Int. Cl.
*H03K 5/134* (2014.01)
*H03K 5/00* (2006.01)

(52) U.S. Cl.
CPC ... *H03K 5/134* (2014.07); *H03K 2005/00019* (2013.01)

(58) Field of Classification Search
CPC .......... H03K 5/133; H03K 5/134; H03K 5/14; H03K 2005/00019
USPC ....... 327/261, 276, 277, 278, 281, 284, 285, 327/288
See application file for complete search history.

(56) References Cited

U.S. PATENT DOCUMENTS

| | | | | |
|---|---|---|---|---|
| 4,922,141 A | * | 5/1990 | Lofgren | H03H 9/38 327/158 |
| 6,724,338 B1 | * | 4/2004 | Min | H03M 1/168 341/145 |
| 8,004,337 B2 | * | 8/2011 | Brannen | H03K 5/133 327/264 |
| 2006/0284662 A1 | * | 12/2006 | Suda | G01R 31/31922 327/261 |
| 2013/0208550 A1 | * | 8/2013 | Sforzin | G11C 7/1066 365/189.09 |

* cited by examiner

*Primary Examiner* — William Hernandez
(74) *Attorney, Agent, or Firm* — Jianq Chyun IP Office

(57) ABSTRACT

A delay apparatus includes a plurality of stage circuits, a first current source, a second current source and a switch. The stage circuits connected in series to each other. The first current source is coupled to the first power terminal of the first stage circuit. In some embodiments, the second current source is coupled to the first power terminal of the second stage circuit, and the first and second terminals of the switch are respectively coupled to the first power terminal of the first stage circuit and the first power terminal of the second stage circuit. In other embodiments, the first and second terminals of the switch are respectively coupled to the first power terminal of the second stage circuit and the second current source, and the first power terminal of the first stage circuit is coupled to the first power terminal of the second stage circuit through a wire.

14 Claims, 6 Drawing Sheets

DELAY APPARATUS

BACKGROUND OF THE INVENTION

Field of the Invention

The present invention relates to an electronic circuit, and more particularly relates to a delay apparatus.

Description of Related Art

Delay cells can be applied to various electronic circuits, such as delay locker loops (DLL) and phase locked loops (PLL). The delay cell can provide precise delay, so that the DLL or the PLL can produce a specific frequency. In order to obtain the maximum locked range of the DLL or the PLL, it is usually required to maximize operable range of the delay cell. Besides, there is a gap between ideal values and actual values of the delay cell due to deviations of manufacturing process, temperature and voltage. In order to make the actual values (actual delay range) cover a variety of values for application, it is necessary to maximize the operation range of the delay cell.

However, the operation range of conventional delay cells is restricted by single current source, so that the operation range is limited. Lower frequencies are satisfied when operating in higher frequencies, and vice versa.

SUMMARY OF THE INVENTION

The present invention is directed to provide a delay apparatus to have a larger delay operation range.

In an embodiment of the present invention, a delay apparatus is provided. The delay apparatus includes a plurality of stage circuits, a first current source, a second current source and a first switch. The stage circuits are connected in series to each other. The first current source is coupled to a first power terminal of the first stage circuit. The second current source is coupled to a first power terminal of the second stage circuit. A first terminal and a second terminal of the first switch are respectively coupled to the first power terminal of the first stage circuit and the first power terminal of the second stage circuit.

In another embodiment of the present invention, a delay apparatus is provided. The delay apparatus includes a plurality of stage circuits, a first current source, a second current source, a first switch and a first wire. The stage circuits are connected in series to each other. The first current source is coupled to a first power terminal of the first stage circuit. A first terminal of the first switch is coupled to a first power terminal of the second stage circuit. The second current source is coupled to a second terminal of the first switch. A first terminal and a second terminal of the first wire are respectively coupled to the first power terminal of the first stage circuit and the first power terminal of the second stage circuit.

Based on the above, the delay apparatus disclosed in the embodiment of the present invention has at least a normal mode and an overclocking mode. The overclocking mode can be implemented by the delay apparatus by way of connecting the switches with the idle current sources. The delay operation range of the delay apparatus can be substantially expanded by switching between the normal mode and the overclocking mode.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
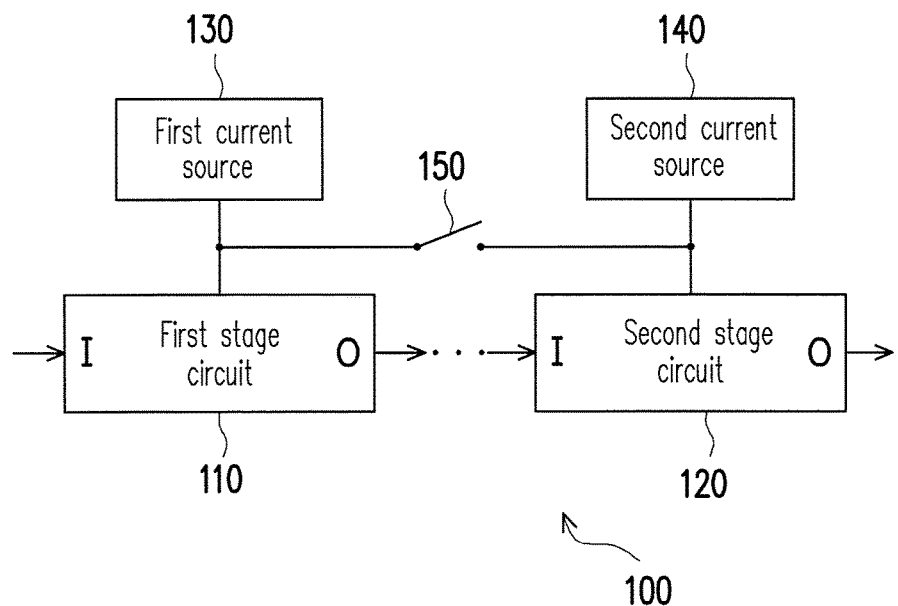
FIG. 1 illustrates a circuit block schematic diagram of delay apparatus according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The term "coupling/coupled" used in this specification (including claims) of the disclosure may refer to any direct or indirect connection means. For example, "a first device is coupled to a second device" should be interpreted as "the first device is directly connected to the second device" or "the first device is indirectly connected to the second device through other devices or connection means." In addition, the term "signal" can refer to a current, a voltage, a charge, a temperature, data, electromagnetic wave or any one or multiple signals.

FIG. 1 illustrates a circuit block schematic diagram of delay apparatus 100 according to an embodiment of the present invention. Delay apparatus 100 includes a plurality of stage circuits, e.g., first stage circuit 110 and second stage circuit 120 depicted in FIG. 1. In which, the stage circuits are connected in series to each other. That is, output terminal O of the front stage circuit is connected to input terminal I of the post stage circuit. Delay apparatus 100 further includes first current source 130, second current source 140 and first switch 150. First current source 130 is coupled to a first power terminal of first stage circuit 110. Second current source 140 is coupled to a first power terminal of second stage circuit 120. A first terminal and a second terminal of first switch 150 are respectively coupled to the first power terminal of first stage circuit 110 and the first power terminal of second stage circuit 120. First stage circuit 110 and/or second stage circuit 120 may be a buffer circuit, an inverter circuit, an output stage circuit, a delay circuit or other circuits, depending on the design requirements.

In some embodiments, first current source 130 may provide current to the first power terminal of first stage circuit 110, and second current source 140 may provide current to the first power terminal of second stage circuit 120. In some other embodiments, first current source 130 may draw current from the first power terminal of first stage circuit 110, and second current source 140 may draw current from the first power terminal of second stage circuit 120. By determining the current volume of first current source 130, the delay time of first stage circuit 110 can be adjusted correspondingly. Therefore, the adjustment range of the delay time of first stage circuit 110 can be determined by the adjustment range of the current volume of first current source 130. Similarly, by determining the current volume of second current source 140, the delay time of second stage circuit 120 can be adjusted correspondingly. However, the adjustment range of the current volume of the current source may not meet the design requirements.

In some operation scenarios, when some current sources of delay apparatus 100 provide current to the power terminal of the stage circuit (or draw current from the power terminal of the stage circuit), the other current sources of delay apparatus 100 may idle. For example (but which is not limited thereto), when first current source 130 provides current to the power terminal of first stage circuit 110 (or draws current from the power terminal of first stage circuit 110), second current source 140 may idles. The embodiment of FIG. 1 may parallel the idle current sources to the other current sources via first switch 150, so as to expand the adjustment range of the current volume of the current sources, and further to expand the delay operation range of delay apparatus 100.

Delay apparatus 100 has two operation modes, and thus two delay operation ranges can be obtained. The first operation mode is a normal mode. In the normal mode, first switch 150 is in a turn-off state. In the normal mode, one current source is used by one delay cell. For example, first current source 130 only provides current to the first power terminal of first stage circuit 110 (or draws current from the first power terminal of first stage circuit 110), and second current source 140 only provides current to the power terminal of second stage circuit 120 (or draws current from the power terminal of second stage circuit 120). The second operation mode is an overclocking mode. In the overclocking mode, first switch 150 is turned on, and the current being charged and discharged to the stage circuits is thus increased. The current being charged and discharged is increased, which implies that the time constant can be shortened (shorter delay time or higher operation frequency can be obtained).

Comparing to the conventional delay circuits, delay apparatus 100 of FIG. 1 can obtain a broader delay operation range by a switching operation of first switch 150. In some application requirements, the delay time is very short, therefore the closed first switch 150 can increase the current being charged and discharged to the stage circuits. In some other application requirements, the requested delay time is very long, therefore the opened first switch 150 can reduce the current being charged and discharged to the stage circuits.

Figure 2:
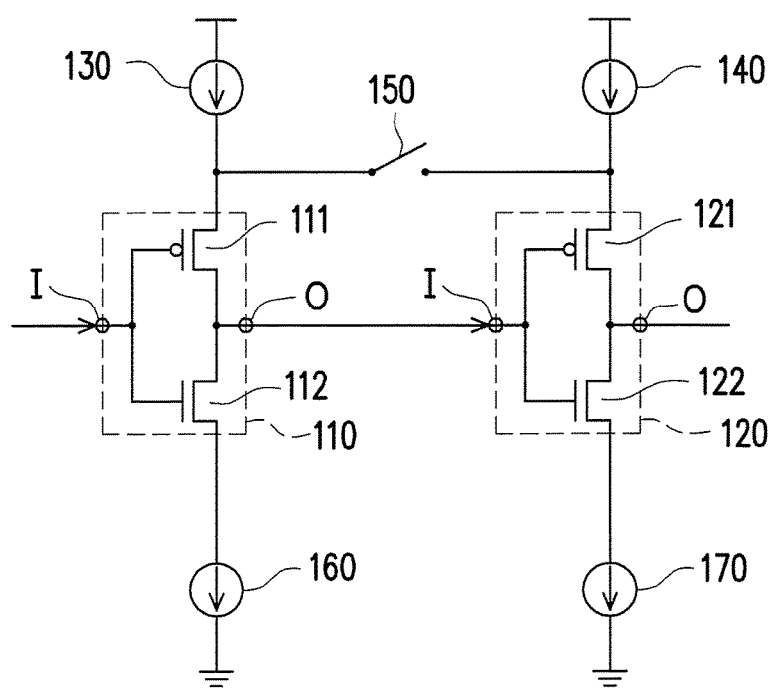
FIG. 2 illustrates a circuit schematic diagram of delay apparatus in FIG. 1 according to an embodiment of the present invention.

FIG. 2 illustrates a circuit schematic diagram of delay apparatus 100 in FIG. 1 according to an embodiment of the present invention. In the embodiment of FIG. 2, first stage circuit 110 includes first transistor 111 and second transistor 112, and second stage circuit 120 includes first transistor 121 and second transistor 122. First transistors 111 and 121 are, for example, P channel metal oxide semiconductors (PMOS), and second transistors 112 and 122 are, for example, N channel metal oxide semiconductors (NMOS).

The control terminal (e.g., gate) of first transistor 111 is coupled to input terminal I of first stage circuit 110. The first terminal (e.g., source) of first transistor 111 is coupled to the first power terminal of first stage circuit 110, and the first power terminal of first stage circuit 110 is connected to first current source 130. The second terminal (e.g., drain) of first transistor 111 is coupled to output terminal O of first stage circuit 110. The control terminal (e.g., gate) of second transistor 112 is coupled to input terminal I of first stage circuit 110. The first terminal (e.g., source) of second transistor 112 is coupled to the second power terminal of first stage circuit 110, and the second power terminal of first stage circuit 110 is connected to third current source 160. The second terminal (e.g., drain) of second transistor 112 is coupled to output terminal O of first stage circuit 110. The control terminal (e.g., gate) of first transistor 121 is coupled to input terminal I of second stage circuit 120. The first terminal (e.g., source) of first transistor 121 is coupled to the first power terminal of second stage circuit 120, and the first power terminal of second stage circuit 120 is connected to second current source 140. The second terminal (e.g., drain) of first transistor 121 is coupled to output terminal O of second stage circuit 120. The control terminal (e.g., gate) of second transistor 122 is coupled to input terminal I of second stage circuit 120. The first terminal (e.g., source) of second transistor 122 is coupled to the second power terminal of second stage circuit 120, and the second power terminal of second stage circuit 120 is connected to fourth current source 170. The second terminal (e.g., drain) of second transistor 122 is coupled to output terminal O of second stage circuit 120.

When input terminal I of first stage circuit 110 receives a descending voltage, first transistor 111 is turned on, therefore the current of first current source 130 flows through first transistor 111 and charges input terminal I of second stage circuit 120. At this time, second transistor 112 is turned off so that third current source 160 stays idle. For second stage circuit 120, input terminal I thereof receives an ascending voltage, so second transistor 122 is turned on. Accordingly, fourth current source 170 draws the current of output terminal O of second stage circuit 120 through second transistor 122 (discharges output terminal O of second stage circuit 120). At this time, first transistor 121 is turned off. First switch 150 is turned off in the normal mode, therefore second current source 140 stays idle. First switch 150 is turned on in the overclocking mode, so the idle second current source 140 may provide current to the first power terminal of first stage circuit 110, and the delay time of first stage circuit 110 is thus shortened.

On the contrary, when input terminal I of first stage circuit 110 receives an ascending voltage, second transistor 112 is turned on, therefore third current source 160 draws the current of output terminal O of first stage circuit 110 through second transistor 112 (discharges output terminal O of first stage circuit 110). At this time, first transistor 111 is turned off. First switch 150 is turned off in the normal mode, therefore first current source 130 stays idle. For second stage circuit 120, input terminal I thereof receives a descending voltage, so first transistor 121 is turned on. Therefore, the current of second current source 140 flows through first transistor 121 and charges output terminal O of second stage circuit 120. At this time, second transistor is turned off so that fourth current source 170 stays idle. First switch 150 is turned on in the overclocking mode, so the idle first current source 130 may provide current to the first power terminal of second stage circuit 120, and the delay time of second stage circuit 120 is thus shortened. The present embodiment expands the delay operation range of delay apparatus 100 by way of connecting the idle current sources.

Figure 3:
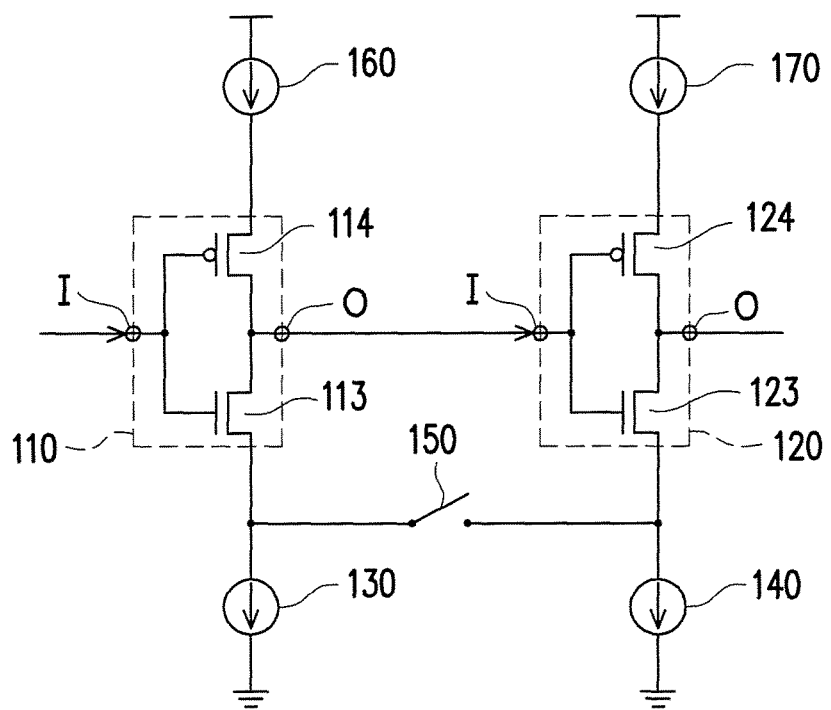
FIG. 3 illustrates a circuit schematic diagram of delay apparatus in FIG. 1 according to another embodiment of the present invention.

FIG. 3 illustrates a circuit schematic diagram of delay apparatus 100 in FIG. 1 according to another embodiment of the present invention. In the embodiment of FIG. 3, first stage circuit 110 includes first transistor 113 and second transistor 114, and second stage circuit 120 includes first transistor 123 and second transistor 124. For example, first transistors 113 and 123 are NMOS transistors, and second transistors 114 and 124 are PMOS transistors. The gate of first transistor 113 is coupled to input terminal I of first stage circuit 110. The source of first transistor 113 is coupled to the first power terminal of first stage circuit 110, and the first power terminal of first stage circuit 110 is connected to first current source 130. The drain of first transistor 113 is coupled to output terminal O of first stage circuit 110. The gate of second transistor 114 is coupled to input terminal I of first stage circuit 110. The source of second transistor 114 is coupled to the second power terminal of first stage circuit 110, and the second power terminal of first stage circuit 110 is connected to third current source 160. The drain of second transistor 114 is coupled to output terminal O of first stage circuit 110. The gate of first transistor 123 is coupled to input terminal I of second stage circuit 120. The source of first transistor 123 is coupled to the first power terminal of second stage circuit 120, and the first power terminal of second stage circuit 120 is connected to second current source 140. The drain of first transistor 123 is coupled to output terminal O of second stage circuit 120. The gate of second transistor 124 is coupled to input terminal I of second stage circuit 120. The source of second transistor 124 is coupled to the second power terminal of second stage circuit 120, and the second power terminal of second stage circuit 120 is connected to fourth current source 170. The drain of second transistor 124 is coupled to output terminal O of second stage circuit 120.

When input terminal I of first stage circuit 110 receives a descending voltage, second transistor 114 is turned on, therefore the current of third current source 160 flows through second transistor 114 and charges input terminal I of second stage circuit 120. At this time, first transistor 113 is turned off. First switch 150 is turned off in the normal mode, therefore first current source 130 stays idle. For second stage circuit 120, input terminal I thereof receives an ascending voltage, so first transistor 123 is turned on. Accordingly, second current source 140 draws the current of output terminal O of second stage circuit 120 through first transistor 123 (discharges output terminal O of second stage circuit 120). At this time, second transistor 124 is turned off. First switch 150 is turned on in the overclocking mode, so the idle first current source 130 may draw current from the first power terminal of second stage circuit 120, and the delay time of second stage circuit 120 is thus shortened.

On the contrary, when input terminal I of first stage circuit 110 receives an ascending voltage, first transistor 113 is turned on, therefore first current source 130 draws the current of output terminal O of first stage circuit 110 through first transistor 113 (discharges output terminal O of first stage circuit 110). At this time, second transistor 114 is turned off so that third current source 160 stays idle. For second stage circuit 120, input terminal I thereof receives a descending voltage, so second transistor 124 is turned on. Therefore, the current of fourth current source 170 flows through second transistor 124 and charges output terminal O of second stage circuit 120. At this time, first transistor 123 is turned off. First switch 150 is turned off in the normal mode, therefore second current source 140 stays idle. First switch 150 is turned on in the overclocking mode, so the idle second current source 140 may draw current from the first power terminal of first stage circuit 110, and the delay time of first stage circuit 110 is thus shortened.

Figure 4:
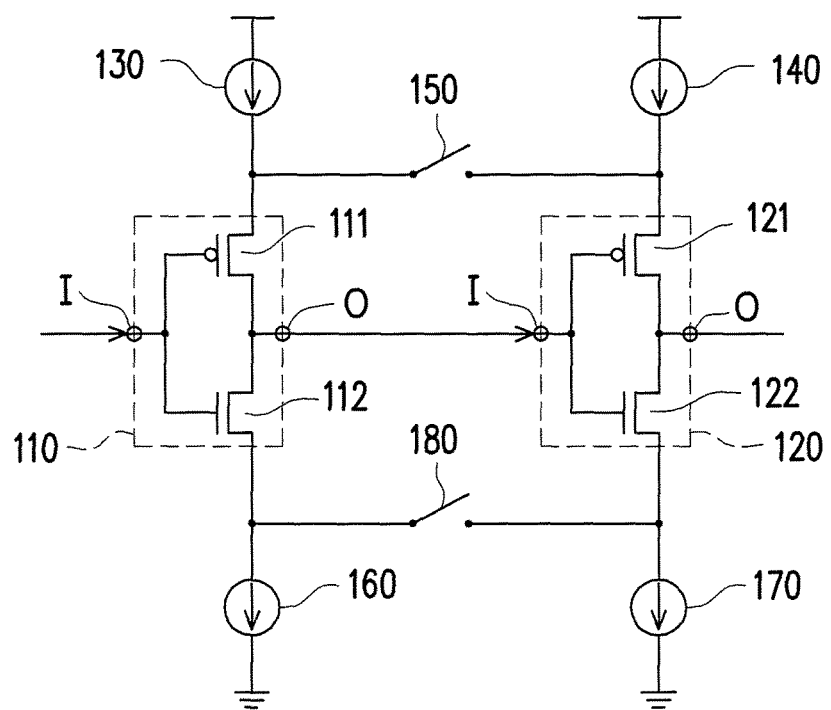
FIG. 4 illustrates a circuit schematic diagram of delay apparatus in FIG. 1 according to still another embodiment of the present invention.

FIG. 4 illustrates a circuit schematic diagram of delay apparatus 100 in FIG. 1 according to still another embodiment of the present invention. First stage circuit 110, second stage circuit 120, first current source 130, second current source 140, first switch 150, third current source 160 and fourth current source 170 depicted in FIG. 4 can be referred to the related descriptions of FIG. 1 and/or FIG. 2. First current source 130 provides current to the first power terminal of the first stage circuit 110. Second current source 140 provides current to the first power terminal of the second stage circuit 120. Third current source 160 is coupled to a second power terminal of first stage circuit 110. Third current source 160 draws current from the second power terminal of the first stage circuit 110. Fourth current source 170 is coupled to a second power terminal of second stage circuit 120. Fourth current source 140 draws current from the second power terminal of the second stage circuit 120. A first terminal and a second terminal of the second switch 180 are respectively coupled to the second power terminal of the first stage circuit 110 and the second power terminal of the second stage circuit 120.

In the normal mode, first switch 150 and second switch 180 are turned off. When input terminal I of first stage circuit 110 receives a descending voltage, first transistor 111 is turned on and second transistor 112 is turned off. Therefore, the current of first current source 130 flows through first transistor 111 and charges input terminal I of second stage circuit 120, and third current source 160 stays idle. For second stage circuit 120, input terminal I thereof receives an ascending voltage, so second transistor 122 is turned on, and first transistor 121 is turned off. Accordingly, fourth current source 170 draws the current of output terminal O of second stage circuit 120 through second transistor 122 (discharges output terminal O of second stage circuit 120), and second current source 140 stays idle. In the overclocking mode, first switch 150 and second switch 180 are turned on, so the idle second current source 140 may provide current to the first power terminal of first stage circuit 110 through first switch 150, and the idle third current source 160 may draw current of the second power terminal of second stage circuit 120 through second switch 180. Thus, the delay time of first stage circuit 110 and second stage circuit 120 are shortened.

In the normal mode, first switch 150 and second switch 180 are turned off. When input terminal I of first stage circuit 110 receives an ascending voltage, second transistor 112 is turned on and first transistor 111 is turned off Therefore, third current source 160 draws the current of output terminal O of first stage circuit 110 through second transistor 112 (discharges output terminal O of first stage circuit 110), and first current source 130 stays idle. For second stage circuit 120, input terminal I thereof receives a descending voltage, so first transistor 121 is turned on and second transistor 122 is turned off. Therefore, the current of second current source 140 flows through first transistor 121 and charges output terminal O of second stage circuit 120, and fourth current source 170 stays idle. In the overclocking mode, first switch 150 and second switch 180 are turned on, so the idle first current source 130 may provide current to the first power terminal of second stage circuit 120 through first switch 150, and the idle fourth current source 170 may draw current of the second power terminal of first stage circuit 110 through second switch 180. Thus, the delay time of first stage circuit 110 and second stage circuit 120 are shortened.

Figure 5:
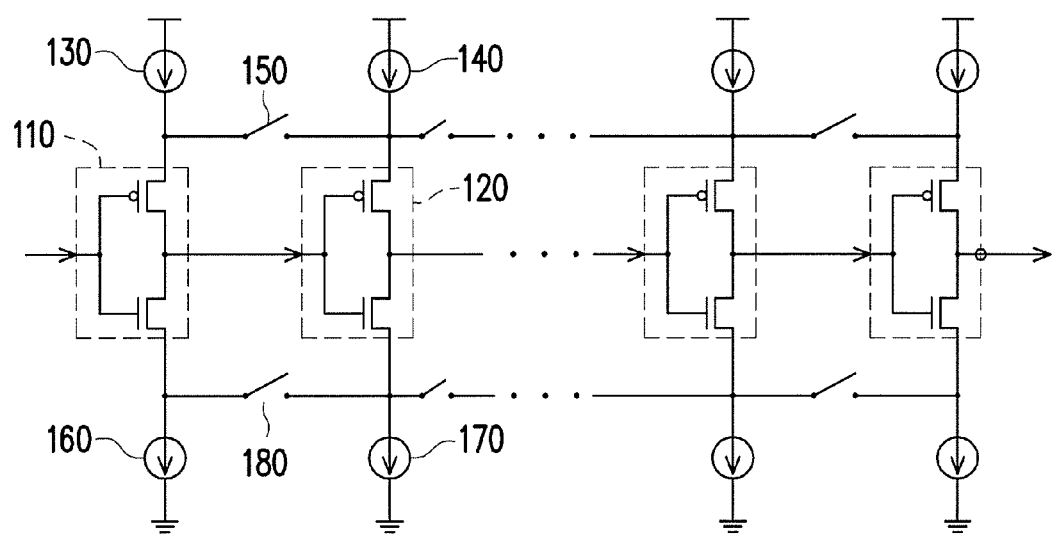
FIG. 5 illustrates a circuit schematic diagram of delay apparatus in FIG. 1 according to still another embodiment of the present invention.

FIG. 5 illustrates a circuit schematic diagram of delay apparatus 100 in FIG. 1 according to still another embodiment of the present invention. The delay apparatus depicted in FIG. 5 includes more stage circuits connected in series to each other. First stage circuit 110, second stage circuit 120, first current source 130, second current source 140, first switch 150, third current source 160, fourth current source 170 and second switch 180 depicted in FIG. 5 can be referred to the related descriptions of FIG. 4. The delay apparatus depicted in FIG. 5 can be deduced by analogy from the descriptions of FIG. 4 to more stage circuits connected in series to each other, therefore the implementation details are not repeated herein.

Figure 6:
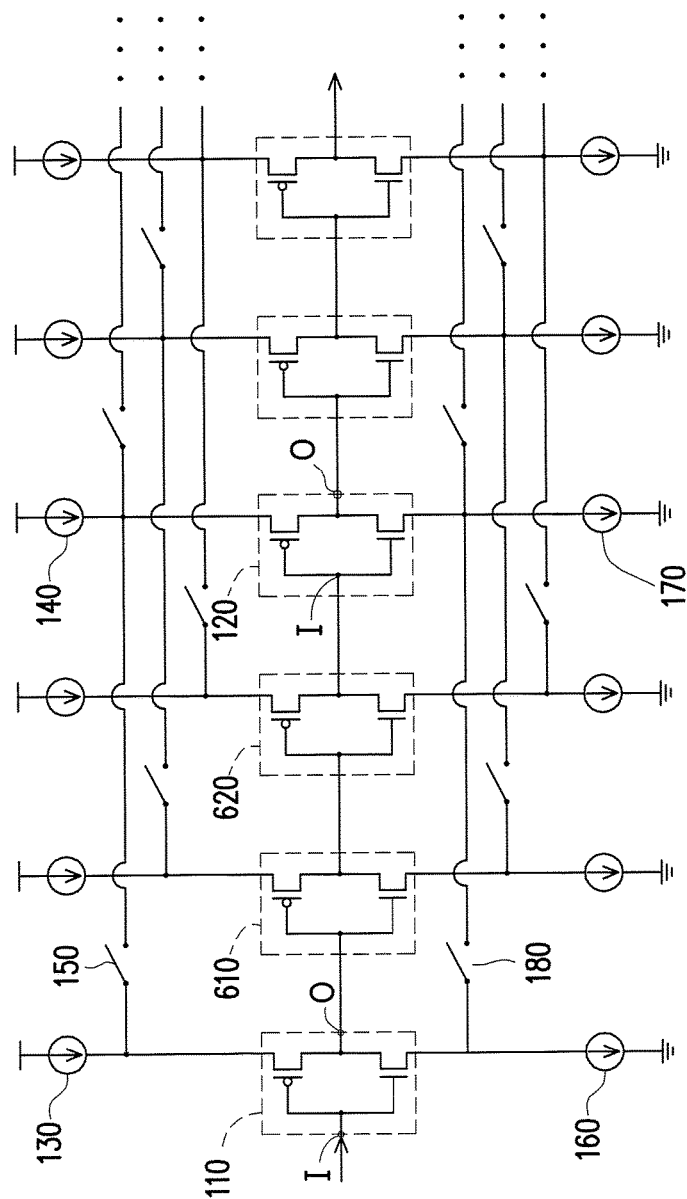
FIG. 6 illustrates a circuit schematic diagram of delay apparatus in FIG. 1 according to still another embodiment of the present invention.

FIG. 6 illustrates a circuit schematic diagram of delay apparatus 100 in FIG. 1 according to still another embodiment of the present invention. The delay apparatus depicted in FIG. 6 includes more stage circuits connected in series to each other. First stage circuit 110, second stage circuit 120, first current source 130, second current source 140, first switch 150, third current source 160, fourth current source 170 and second switch 180 depicted in FIG. 6 can be referred to the related descriptions of FIG. 4. In the embodiment of FIG. 6, There are other stage circuits 610 and 620 between output terminal O of first stage circuit 110 and input terminal I of second stage circuit 120. These stage circuits (e.g., 110, 610, 620 and 120) are connected in series to each other. The implementation details and operation procedures of the additional stage circuits (e.g., 610 and 620) can be deduced by analogy from the related descriptions of FIG. 4, which is not repeated herein.

Figure 7:
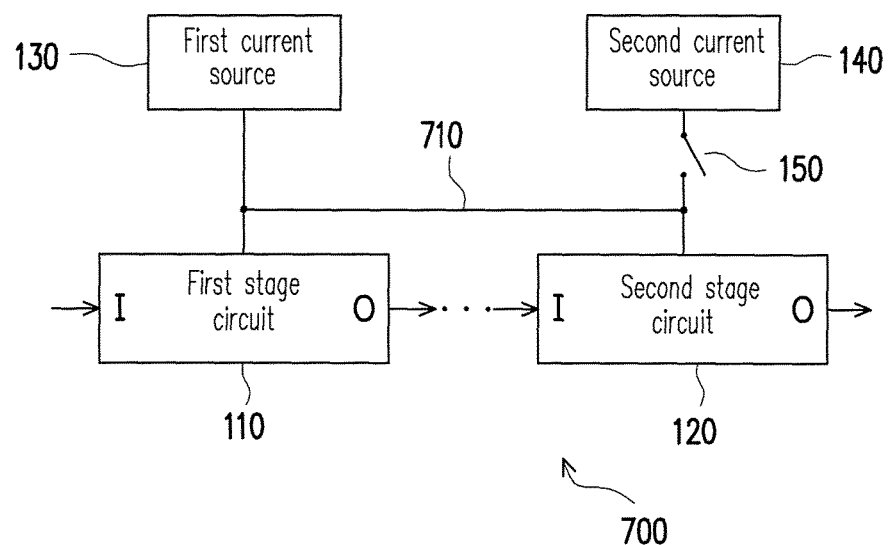
FIG. 7 illustrates a circuit block schematic diagram of delay apparatus according to another embodiment of the present invention.

FIG. 7 illustrates a circuit block schematic diagram of delay apparatus 700 according to another embodiment of the present invention. Delay apparatus 700 includes a plurality of stage circuits, e.g., first stage circuit 110 and second stage circuit 120 depicted in FIG. 7, in which the stage circuits are connected in series to each other. That is, output terminal O of the front stage circuit is connected to input terminal I of the post stage circuit. Delay apparatus 700 further includes first current source 130, second current source 140 and first switch 150. First stage circuit 110, second stage circuit 120, first current source 130, second current source 140 and first switch 150 depicted in FIG. 7 can be deduced by analogy referring to the related descriptions of FIG. 1 to FIG. 6.

In the embodiment of FIG. 7, First current source 130 is coupled to a first power terminal of first stage circuit 110. A first terminal of first switch 150 is coupled to a first power terminal of second stage circuit 120. Second current source 140 is coupled to a second terminal of first switch 150. A first terminal and a second terminal of first wire 710 are respectively coupled to the first power terminal of first stage circuit 110 and the first power terminal of second stage circuit 120.

In some embodiments, first current source 130 may provide current to the first power terminal of first stage circuit 110 and the first power terminal of second stage circuit 120, and second current source 140 may provide current to the first power terminal of first stage circuit 110 and the first power terminal of second stage circuit 120 through first switch 150. In some other embodiments, first current source 130 may draw current from the first power terminal of first stage circuit 110 and the first power terminal of second stage circuit 120, and second current source 140 may draw current from the first power terminal of first stage circuit 110 and the first power terminal of second stage circuit 120 through first switch 150.

Delay apparatus 700 has two operation modes, and thus obtains two delay operation ranges. The first operation mode is a normal mode. In the normal mode, first switch 150 is in a turn-off state. In the normal mode, first current source 130 provides current to the first power terminal of first stage circuit 110 and second stage circuit 120 (or draws current from the first power terminal of first stage circuit 110 and second stage circuit 120). The second operation mode is an overclocking mode. First switch 150 is turned on in the overclocking mode. Therefore, first current source 130 and second current source 140 may provide current to the first power terminal of first stage circuit 110 and second stage circuit 120 together (or draws current from the first power terminal of first stage circuit 110 and second stage circuit 120 together). Hence the current being charged and discharged to the stage circuits is increased in the overclocking mode. The current being charged and discharged is increased, which implies that the time constant can be shortened (shorter delay time or higher operation frequency is obtained).

Figure 8:
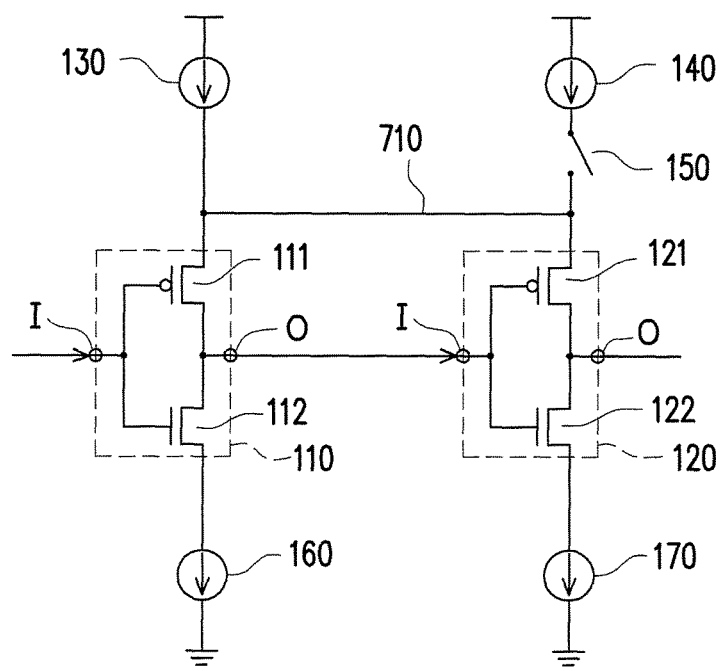
FIG. 8 illustrates a circuit schematic diagram of delay apparatus in FIG. 7 according to an embodiment of the present invention.

FIG. 8 illustrates a circuit schematic diagram of delay apparatus 700 of FIG. 7 according to an embodiment of the present invention. In the embodiment of FIG. 8, first stage circuit 110 includes first transistor 111 and second transistor 112, and second stage circuit 120 includes first transistor 121 and second transistor 122. First stage circuit 110, second stage circuit 120, third current source 160 and fourth current source 170 depicted in FIG. 8 can be deduced by analogy referring to the related descriptions of FIG. 2, which is not repeated herein.

When input terminal I of first stage circuit 110 receives a descending voltage, first transistor 111 is turned on, therefore the current of first current source 130 flows through first transistor 111 and charges input terminal I of second stage circuit 120. At this time, second transistor 112 is turned off so that third current source 160 stays idle. For second stage circuit 120, input terminal I thereof receives an ascending voltage, so second transistor 122 is turned on. Accordingly, fourth current source 170 draws the current of output terminal O of second stage circuit 120 through second transistor 122 (discharges output terminal O of second stage circuit 120). At this time, first transistor 121 is turned off. First switch 150 is turned off in the normal mode, therefore second current source 140 stays idle. First switch 150 is turned on in the overclocking mode, so first current source 130 and second current source 140 may provide current to the first power terminal of first stage circuit 110 together, and the delay time of first stage circuit 110 is thus shortened.

On the contrary, when input terminal I of first stage circuit 110 receives an ascending voltage, second transistor 112 is turned on, therefore third current source 160 draws the current of output terminal O of first stage circuit 110 through second transistor 112 (discharges output terminal O of first stage circuit 110). At this time, first transistor 111 is turned off. For second stage circuit 120, input terminal I thereof receives a descending voltage, so first transistor 121 is turned on. Therefore, the current of first current source 130 flows through first transistor 121 and charges output terminal O of second stage circuit 120. At this time, second transistor is turned off so that fourth current source 170 stays idle. First switch 150 is turned off in the normal mode, therefore second current source 140 stays idle. First switch 150 is turned on in the overclocking mode, so first current source 130 and second current source 140 may provide current to the first power terminal of second stage circuit 120 together, and the delay time of second stage circuit 120 is thus shortened. The present embodiment expands the delay operation range of delay apparatus 700 by way of connecting the idle current sources.

Figure 9:
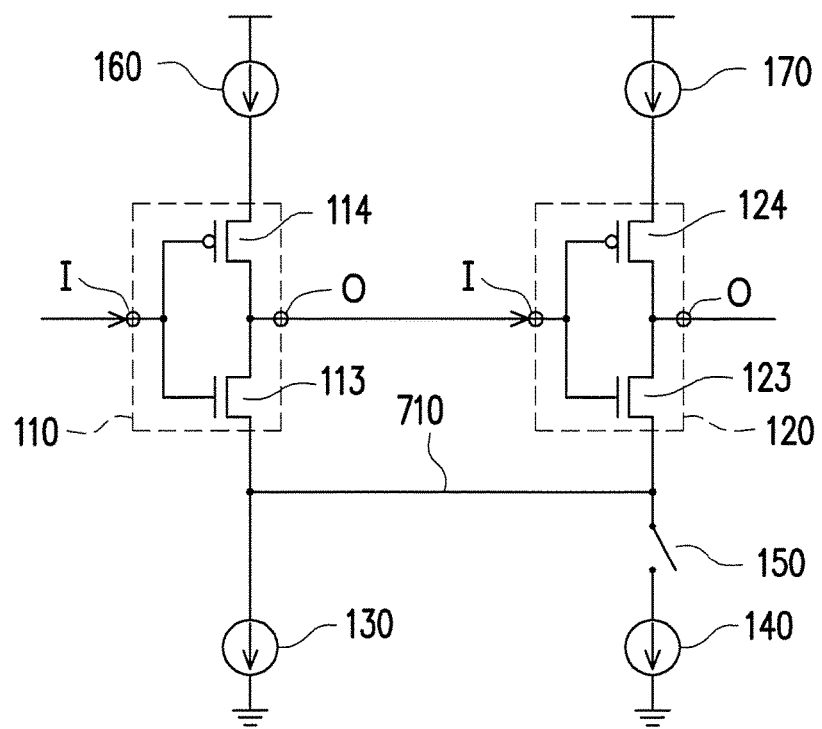
FIG. 9 illustrates a circuit schematic diagram of delay apparatus in FIG. 7 according to another embodiment of the present invention.

FIG. 9 illustrates a circuit schematic diagram of delay apparatus 700 in FIG. 7 according to another embodiment of the present invention. In the embodiment of FIG. 9, first stage circuit 110 includes first transistor 113 and second transistor 114, and second stage circuit 120 includes first transistor 123 and second transistor 124. First stage circuit 110, second stage circuit 120, third current source 160 and fourth current source 170 depicted in FIG. 9 can be deduced by analogy referring to the related descriptions of FIG. 3, which is not repeated herein.

When input terminal I of first stage circuit 110 receives a descending voltage, second transistor 114 is turned on, therefore the current of third current source 160 flows through second transistor 114 and charges input terminal I of second stage circuit 120. At this time, first transistor 113 is turned off. For second stage circuit 120, input terminal I thereof receives an ascending voltage, so first transistor 123 is turned on. Accordingly, first current source 130 draws the current of output terminal O of second stage circuit 120 through first transistor 123 (discharges output terminal O of second stage circuit 120). At this time, second transistor 124 is turned off, hence fourth current source 170 stays idle. First switch 150 is turned off in the normal mode, therefore second current source 140 stays idle. First switch 150 is turned on in the overclocking mode, so first current source 130 and second current source 140 may draw current from the first power terminal of second stage circuit 120 together, and the delay time of second stage circuit 120 is thus shortened.

On the contrary, when input terminal I of first stage circuit 110 receives an ascending voltage, first transistor 113 is turned on, therefore first current source 130 draws the current of output terminal O of first stage circuit 110 through first transistor 113 (discharges output terminal O of first stage circuit 110). At this time, second transistor 114 is turned off so that third current source 160 stays idle. For second stage circuit 120, input terminal I thereof receives a descending voltage, so second transistor 124 is turned on. Therefore, the current of fourth current source 170 flows through second transistor 124 and charges output terminal O of second stage circuit 120. At this time, first transistor 123 is turned off. First switch 150 is turned off in the normal mode, therefore second current source 140 stays idle. First switch 150 is turned on in the overclocking mode, so first current source 130 and second current source 140 may draw current from the first power terminal of first stage circuit 110 together, and the delay time of first stage circuit 110 is thus shortened.

Figure 10:
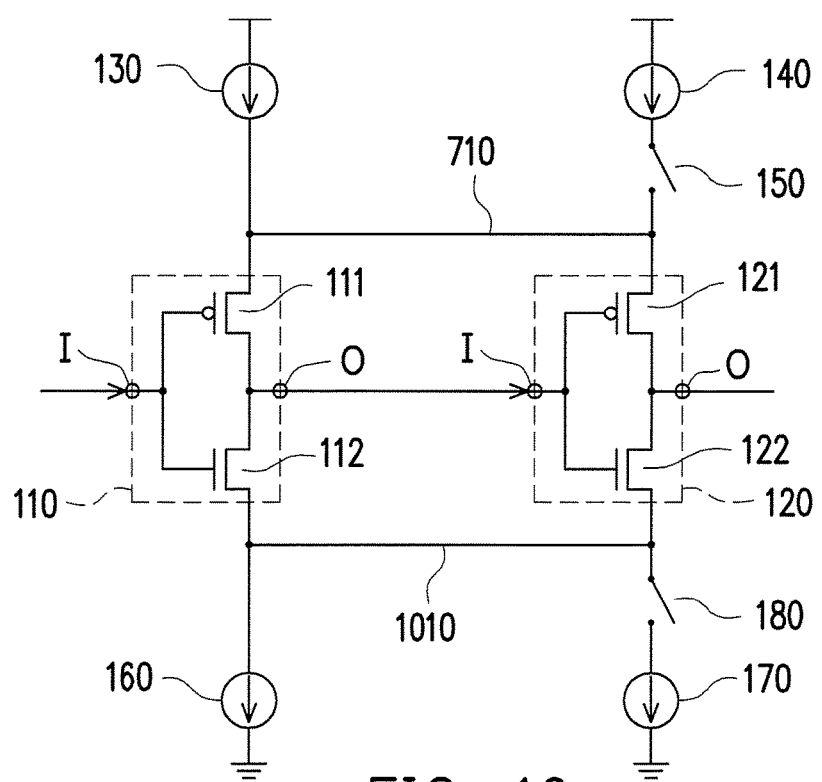
FIG. 10 illustrates a circuit schematic diagram of delay apparatus in FIG. 7 according to still another embodiment of the present invention.

FIG. 10 illustrates a circuit schematic diagram of delay apparatus 700 in FIG. 7 according to still another embodiment of the present invention. First stage circuit 110, second stage circuit 120, first current source 130, second current source 140, first switch 150, third current source 160 and fourth current source 170 depicted in FIG. 10 can be referred to the related descriptions of FIG. 7 and/or FIG. 8. First current source 130 provides current to the first power terminal of first stage circuit 110 and the first power terminal of second stage circuit 120. Second current source 140 provides current to the first power terminal of first stage circuit 110 and the first power terminal of second stage circuit 120 through first switch 150. Third current source 160 is coupled to a second power terminal of first stage circuit 110. A first terminal and a second terminal of second wire 1010 are respectively coupled to the second power terminal of first stage circuit 110 and the second power terminal of second stage circuit 120. Third current source 160 draws current from the second power terminal of the first stage circuit 110, and draws current from the second power terminal of second stage circuit 120. A first terminal of second switch 180 is coupled to a second power terminal of second stage circuit 120. Fourth current source 170 is coupled to a second terminal of second switch 180. Fourth current source 180 draws current from the second power terminal of first stage circuit 110 and the second power terminal of second stage circuit 120 through second switch 180.

When input terminal I of first stage circuit 110 receives a descending voltage, first transistor 111 is turned on and second transistor 112 is turned off. Therefore, the current of first current source 130 flows through first transistor 111 and charges input terminal I of second stage circuit 120. For second stage circuit 120, input terminal I thereof receives an ascending voltage, so second transistor 122 is turned on and first transistor 121 is turned off. Accordingly, third current source 160 may draw the current of output terminal O of second stage circuit 120 through second transistor 122 (discharges output terminal O of second stage circuit 120). First switch 150 and second switch 180 are turned off in the normal mode, so that second current source 140 and fourth current source 170 stay idle. In the overclocking mode, first switch 150 and second switch 180 are turned on, so first current source 130 and second current source 140 may provide current to the first power terminal of first stage circuit 110 together, and third current source 160 and fourth current source 170 may draw current of the second power terminal of second stage circuit 120 together. Thus, the delay time of first stage circuit 110 and second stage circuit 120 are shortened.

When input terminal I of first stage circuit 110 receives an ascending voltage, second transistor 112 is turned on and first transistor 111 is turned off. Therefore, third current source 160 may draw the current of output terminal O of first stage circuit 110 through second transistor 112 (discharges output terminal O of first stage circuit 110). For second stage circuit 120, input terminal I thereof receives a descending voltage, so first transistor 121 is turned on and second transistor 122 is turned off. Therefore, the current of first current source 130 flows through first transistor 121 and charges output terminal O of second stage circuit 120. First switch 150 and second switch 180 are turned off in the normal mode, so that second current source 140 and fourth current source 170 stay idle. In the overclocking mode, first switch 150 and second switch 180 are turned on, so first current source 130 and second current source 140 may provide current to the first power terminal of second stage circuit 120 together, and third current source 160 and fourth current source 170 may draw current of the second power terminal of first stage circuit 110 together. Thus, the delay time of first stage circuit 110 and second stage circuit 120 are shortened.

In summary, the delay apparatus disclosed in the embodiments of the present invention has at least a normal mode and an overclocking mode. The overclocking mode can be implemented by the delay apparatus by way of connecting the switches with the idle current sources. The delay operation range of the delay apparatus can be substantially expanded by switching between the normal mode and the overclocking mode. Comparing to the conventional delay cells, the delay apparatus disclosed in the embodiments of the present invention has broader delay range and operation frequency within similar cost of area.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A delay apparatus, comprising:
   a plurality of stage circuits connected in series to each other, wherein the stage circuits comprise a first stage circuit and a second stage circuit;
   a first current source coupled to a first power terminal of the first stage circuit;
   a second current source coupled to a first power terminal of the second stage circuit; and
   a first switch having a first terminal and a second terminal, wherein the first terminal and the second terminal of the first switch are respectively coupled to the first power terminal of the first stage circuit and the first power terminal of the second stage circuit.

2. The delay apparatus as recited in claim 1, wherein the first stage circuit is a first buffer circuit, and the second stage circuit is a second buffer circuit.

3. The delay apparatus as recited in claim 1, wherein the first stage circuit comprises:
   a first transistor having a control terminal, a first terminal and a second terminal, wherein the control terminal of the first transistor is coupled to an input terminal of the first stage circuit, the first terminal of the first transistor is coupled to the first power terminal of the first stage circuit, the second terminal of the first transistor is coupled to an output terminal of the first stage circuit; and
   a second transistor having a control terminal, a first terminal and a second terminal, wherein the control terminal of the second transistor is coupled to the input terminal of the first stage circuit, the first terminal of the second transistor is coupled to a second power terminal of the first stage circuit, the second terminal of the second transistor is coupled to the output terminal of the first stage circuit.

4. The delay apparatus as recited in claim 1, wherein the first current source provides current to the first power terminal of the first stage circuit, and the second current source provides current to the first power terminal of the second stage circuit.

5. The delay apparatus as recited in claim 1, wherein the first current source draws current from the first power terminal of the first stage circuit, and the second current source draws current from the first power terminal of the second stage circuit.

6. The delay apparatus as recited in claim 1, further comprising:
   a third current source coupled to a second power terminal of the first stage circuit;
   a fourth current source coupled to a second power terminal of the second stage circuit; and
   a second switch having a first terminal and a second terminal, wherein the first terminal and the second terminal of the second switch are respectively coupled to the second power terminal of the first stage circuit and the second power terminal of the second stage circuit.

7. The delay apparatus as recited in claim 6, wherein the first current source provides current to the first power terminal of the first stage circuit, the third current source draws current from the second power terminal of the first stage circuit, the second current source provides current to the first power terminal of the second stage circuit, and the fourth current source draws current from the second power terminal of the second stage circuit.

8. A delay apparatus, comprising:
   a plurality of stage circuits connected in series to each other, wherein the stage circuits comprise a first stage circuit and a second stage circuit;
   a first current source coupled to a first power terminal of the first stage circuit;
   a first switch having a first terminal and a second terminal, wherein the first terminal of the first switch is coupled to a first power terminal of the second stage circuit;
   a second current source coupled to the second terminal of the first switch; and
   a first wire having a first terminal and a second terminal, wherein the first terminal and the second terminal of the first wire are respectively coupled to the first power terminal of the first stage circuit and the first power terminal of the second stage circuit.

9. The delay apparatus as recited in claim 8, wherein the first stage circuit is a first buffer circuit, and the second stage circuit is a second buffer circuit.

10. The delay apparatus as recited in claim 8, wherein the first stage circuit comprises:
    a first transistor having a control terminal, a first terminal and a second terminal, wherein the control terminal of the first transistor is coupled to an input terminal of the first stage circuit, the first terminal of the first transistor is coupled to the first power terminal of the first stage circuit, the second terminal of the first transistor is coupled to an output terminal of the first stage circuit; and
    a second transistor having a control terminal, a first terminal and a second terminal, wherein the control terminal of the second transistor is coupled to the input terminal of the first stage circuit, the first terminal of the second transistor is coupled to a second power terminal of the first stage circuit, the second terminal of the second transistor is coupled to the output terminal of the first stage circuit.

11. The delay apparatus as recited in claim 8, wherein the first current source provides current to the first power terminal of the first stage circuit and the first power terminal of the second stage circuit, and the second current source provides current to the first power terminal of the first stage circuit and the first power terminal of the second stage circuit through the first switch.

12. The delay apparatus as recited in claim 8, wherein the first current source draws current from the first power terminal of the first stage circuit and the first power terminal of the second stage circuit, and the second current source draws current from the first power terminal of the first stage circuit and the first power terminal of the second stage circuit through the first switch.

13. The delay apparatus as recited in claim 8, further comprising:
    a third current source coupled to a second power terminal of the first stage circuit;
    a second switch having a first terminal and a second terminal, wherein the first terminal of the second switch is coupled to a second power terminal of the second stage circuit;

a fourth current source coupled to the second terminal of the second switch; and a second wire having a first terminal and a second terminal, wherein the first terminal and the second terminal of the second wire are respectively coupled to the second power terminal of the first stage circuit and the second power terminal of the second stage circuit.

14. The delay apparatus as recited in claim 13, wherein the first current source provides current to the first power terminal of the first stage circuit and the first power terminal of the second stage circuit, the third current source draws current from the second power terminal of the first stage circuit and the second power terminal of the second stage circuit, the second current source provides current to the first power terminal of the first stage circuit and the first power terminal of the second stage circuit through the first switch, and the fourth current source draws current from the second power terminal of the first stage circuit and the second power terminal of the second stage circuit through the second switch.

* * * * *